United States Patent
Lee et al.

(10) Patent No.: US 8,383,433 B2
(45) Date of Patent: Feb. 26, 2013

(54) LIGHT EMITTING DIODE AND METHOD OF FABRICATING THE SAME

(75) Inventors: Sum Geun Lee, Ansan-si (KR); Jin Cheol Shin, Ansan-si (KR); Jong Kyu Kim, Ansan-si (KR); Chang Youn Kim, Ansan-si (KR)

(73) Assignee: Seoul Opto Device Co., Ltd., Ansan-si (KR)

( * ) Notice: Subject to any disclaimer, the term of this patent is extended or adjusted under 35 U.S.C. 154(b) by 83 days.

(21) Appl. No.: 13/080,116

(22) Filed: Apr. 5, 2011

(65) Prior Publication Data
US 2012/0080695 A1     Apr. 5, 2012

(30) Foreign Application Priority Data

Apr. 6, 2010  (KR) .................. 10-2010-0031180
Sep. 24, 2010  (KR) .................. 10-2010-0092901

(51) Int. Cl.
*H01L 21/00* (2006.01)
*H01L 33/00* (2010.01)

(52) U.S. Cl. .......................... 438/29; 257/98
(58) Field of Classification Search ............ 257/98–103, 257/E27.121–E27.127; 438/22–29
See application file for complete search history.

(56) References Cited

U.S. PATENT DOCUMENTS

| 7,417,259 B2 | 8/2008 | Sakai et al. |
| 7,883,910 B2 * | 2/2011 | Tsai et al. .................. 438/22 |
| 2009/0166645 A1 | 7/2009 | Lee |
| 2011/0198609 A1 * | 8/2011 | Huang ..................... 257/76 |

* cited by examiner

*Primary Examiner* — Calvin Lee
(74) *Attorney, Agent, or Firm* — H.C. Park & Associates, PLC

(57) ABSTRACT

Exemplary embodiments of the present invention disclose a light emitting diode (LED) and a method of fabricating the same. The LED includes a substrate, a semiconductor stack arranged on the substrate, the semiconductor stack including an upper semiconductor layer having a first conductivity type, an active layer, and a lower semiconductor layer having a second conductivity type, isolation trenches separating the semiconductor stack into a plurality of regions, connectors disposed between the substrate and the semiconductor stack, the connectors electrically connecting the plurality of regions to one another, and a distributed Bragg reflector (DBR) having a multi-layered structure, the DBR disposed between the semiconductor stack and the connectors. The connectors are electrically connected to the semiconductor stack through the DBR, and portions of the DBR are disposed between the isolation trenches and the connectors.

33 Claims, 14 Drawing Sheets

PRIOR ART

Prior Art

LIGHT EMITTING DIODE AND METHOD OF FABRICATING THE SAME

CROSS-REFERENCE TO RELATED APPLICATIONS

This application claims priority from and the benefit of Korean Patent Application No. 10-2010-0031180, filed on Apr. 6, 2010, and Korean Patent Application No. 10-2010-0092901, filed on Sep. 24, 2010, which are hereby incorporated by reference for all purposes as if fully set forth herein.

BACKGROUND OF THE INVENTION

1. Field of the Invention

The present invention relates to a light emitting diode (LED) and a method of fabricating the same, and more particularly, to an LED to which a substrate separating process is applied, and a method of fabricating the same.

2. Discussion of the Background

A light emitting diode (LED), which is a semiconductor device having a structure in which an N-type semiconductor and a P-type semiconductor are joined together, emits light through the recombination of electrons and holes. LEDs have been widely used as display devices and backlights. Further, LEDs have lower electric power consumption and a longer lifespan as compared with conventional light bulbs or fluorescent lamps, so that their application areas have been expanded to the use for general illumination while substituting for conventional incandescent bulbs and fluorescent lamps.

Recently, alternating current (AC) LEDs that continuously emit light by being directly connected to an AC power source have been commercialized. For example, an LED that may be directly connected to a high-voltage AC power source is disclosed in U.S. Pat. No. 7,417,259, issued to Sakai, et al.

According to Sakai, et al., LED elements (i.e., light emitting cells) are two-dimensionally connected in series on a single insulating substrate such as a sapphire substrate to form LED arrays. Such LED arrays are connected in reverse parallel to one another on the sapphire substrate. As a result, there is provided a single-chip LED which may be driven by an AC power supply.

In the AC LED as described above, light emitting cells are formed on a substrate used as a growth substrate, e.g., a sapphire substrate. Therefore, the structure of the light emitting cells may be restricted, so that there may be a limitation in improving the light extraction efficiency. In order to solve such a problem, a method of fabricating an AC LED to which a substrate separating process is applied has been disclosed in U.S. Application Publication No. 2009/0166645, applied for by Lee.

FIGS. 1 to 4 are sectional views illustrating a method of fabricating an LED is according to a related art.

Referring to FIG. 1, semiconductor layers including a buffer layer 23, an N-type semiconductor layer 25, an active layer 27 and a P-type semiconductor layer 29 are formed on a sacrificial substrate 21. A first metal layer 31 is formed on the semiconductor layers, and a second metal layer 53 is formed on a substrate 51 which is discrete from the sacrificial substrate 21. The first metal layer 31 may include a reflective metal layer. The second metal layer 53 is joined with the first metal layer 31 so that the substrate 51 is bonded on the semiconductor layers 25, 27, and 29.

Referring to FIG. 2, after the substrate 51 is bonded, the sacrificial substrate 21 is separated using a laser lift-off process. After the sacrificial substrate 21 is separated, the remaining buffer layer 23 is removed so that a surface of the N-type semiconductor layer 25 is exposed.

Referring to FIG. 3, a photolithography and etching technique is used to pattern the semiconductor layers 25, 27, and 29 and the metal layers 31 and 53, so that metal patterns 40 spaced apart from each other and light emitting cells 30 positioned on partial regions of the respective metal patterns are formed. Each of the light emitting cells 30 includes a patterned P-type semiconductor layer 29a, a patterned active layer 27a and a patterned N-type semiconductor layer 25a.

Referring to FIG. 4, metal wires 57 are formed to electrically connect upper surfaces of the light emitting cells 30 to the metal patterns 40 adjacent to the light emitting cells 30, respectively. The metal wires 57 connect the light emitting cells 30 to each other, thereby forming a serial array of light emitting cells 30. In order to be connected with the metal wire 57, an electrode pad 55 may be formed on the N-type semiconductor layer 25a, and another is electrode pad may be formed on the metal pattern 40. Two or more arrays may be formed, and these arrays are connected in reverse parallel, thereby providing an LED capable of being driven under AC power.

According to the related art as described above, the material comprising the substrate 51 may be variously selected to improve the heat dissipation performance of the LED, and a surface of the N-type semiconductor layer 25a may be treated to enhance the light extraction efficiency of the LED. Further, since a first metal layer 31a includes a reflective metal layer to reflect the light which runs from the light emitting cells 30 toward the substrate 51, the light emitting efficiency may be further enhanced.

However, while the semiconductor layers 25, 27 and 29 and the metal layers 31 and 53 in the related art are patterned, etching by-products of metal materials may be stuck to sidewalls of the light emitting cell 30, so that an electrical short circuit may be caused between the N-type and P-type semiconductor layers 25a and 29a. Further, a surface of the first metal layer 31a exposed during the etching of the semiconductor layers 25, 27 and 29 may be easily damaged by plasma. If the first metal layer 31a includes a reflective metal layer such as Ag or Al, such etching damage may increase, causing the LED to deteriorate. The damage of the surface of the metal layer 31a caused by plasma may decrease the adhesion of the wires 57 or the electrode pads 55 which are formed on the surface thereof, and may thereby result in a device failure.

Meanwhile, according to the related art, since the first metal layer 31a may include a reflective metal layer, light emitted from the active layers 27a toward the substrate 51 from the light emitting cells 30 may be reflected away from the substrate 51. However, light may not be reflected in spaces between the light emitting cells 30 due to etching damage or oxidation of the reflective metal layer. Further, because the reflective metal layer may have a maximum reflectance of about 90%, there may be a limitation in improving the reflectance. Furthermore, since the substrate 51 is exposed in regions between the metal patterns 40, light may be absorbed by the substrate 51.

In addition, since the wires 57 are connected onto upper surfaces, i.e., light emitting surfaces, of the N-type semiconductor layers 25a, respectively, the light generated in the active layers 27a may be absorbed by the wires 57 and/or the electrode pads 55 on the light emitting surfaces, so that light loss may occur.

FIG. 5 is a sectional view illustrating an LED having light emitting cells connected in series according to the related art.

Referring to FIG. 5, the LED includes a substrate 51, a bonding metal 41, an adhesive layer 39, an intermediate insulating layer 37, a barrier metal layer 35, a reflective metal layer 33, light emitting cells S1 and S2, an insulating layer 63, and a connector 65.

The substrate 51 is distinguished from a growth substrate (not shown), and is a secondary substrate bonded to nitride semiconductor layers 25, 27, and 29 through the bonding metal 41 after the nitride semiconductor layers 25, 27, and 29 are grown on the growth substrate.

Meanwhile, each of the light emitting cells S1 and S2 includes an n-type nitride semiconductor layer 25, an active layer 27, and a p-type nitride semiconductor layer 29, and an upper surface of the n-type nitride semiconductor layer 25 may be configured to be a roughened surface R.

The intermediate insulating layer 37 is interposed between the substrate 51 and the light emitting cells S1 and S2 so that the light emitting cells S1 and S2 are electrically insulated from the substrate 51. The reflective metal layer 33 and the barrier metal layer 35 are also interposed between the intermediate insulating layer 37 and the light emitting cells S1 and S2. The reflective metal layer 33 reflects light which is generated in the light emitting cells S1 and S2 and is emitted towards the substrate 51, thereby improving the light emitting efficiency. The barrier metal layer 35 covers the reflective metal layer 33 so that the barrier metal layer 35 may prevent the diffusion of the reflective metal layer 33 and the oxidation of the reflective metal layer 33. Further, a portion of the barrier metal layer 35 is exposed by being extended from a region below the light emitting cell S2 to a cell separation region.

The connector 65 connects the n-type semiconductor layer 25 of the light emitting cell S1 to the barrier metal layer 35 so that the light emitting cells S1 and S2 are connected in series. The insulating layer 63 is interposed between the connector 65 and the light emitting cells S1 and S2 to prevent the n-type and p-type semiconductor layers 25 and 29 from being electrically short-circuited by the connector 65.

Silver (Ag) may be used as the reflective metal layer 33. Ag may be easily oxidized and diffused by heat. Further, an etching gas, e.g., $BCl_3/Cl_2$ gas, used to separate the light emitting cells S1 and S2 may easily produce etching by-products through chemical reaction with the Ag. The etching by-products may be stuck to side surfaces of the light emitting cells S1 and S2, and therefore, an electric short circuit may be caused. In order to prevent the electric short circuit in the related art, the reflective metal layer 33 is covered with the barrier metal layer 35, and then the barrier metal layer 35 is configured to be exposed in a separation process of the light emitting cells S1 and S2.

However, since the barrier metal layer 35 is added to protect the reflective metal layer 33 according to the related art, a metal layer deposition process may be complicated. Further, since the reflective metal layer 33 is formed and the barrier metal layer 35 then covers the reflective metal layer 33, a step occurs in a side surface of the reflective metal layer 33. The step increases as the thickness of the reflective metal layer 33 increases. Particularly, if a plurality of metal layers is deposited to form the barrier metal layer 35, stresses may be concentrated around the step, so that cracks may be produced in the barrier metal layer 35. Particularly, since the substrate 51 is bonded at a relatively high temperature, cracks may be produced at the step during the bonding of the substrate 51, so that a device failure may be caused.

Meanwhile, if the reflective metal layer 33 is formed of Ag, the reflectance of the reflective metal layer 33 may be increased compared with forming the reflective metal layer 33 of other metals.

SUMMARY OF THE INVENTION

Exemplary embodiments of the present invention provide a light emitting diode (LED) capable of preventing an electrical short circuit caused by generation of metallic etching by-products, and a method of fabricating the same.

Exemplary embodiments of the present invention also provide an LED capable of reducing loss of light that is emitted towards a substrate from a space between light emitting cells, and a method of fabricating the same.

Exemplary embodiments of the present invention also provide an LED capable of improving light extraction efficiency by increasing the reflectance of the light that is emitted towards a substrate, and a method of fabricating the same.

Exemplary embodiments of the present invention also provide an LED capable of improving light emitting efficiency by reducing a loss of light emitted from a light emitting surface, and a method of fabricating the same.

Exemplary embodiments of the present invention also provide an LED capable of preventing a reflective layer from being deformed by etching or oxidation, and a method of fabricating the same.

Exemplary embodiments of the present invention also provide a method of fabricating an LED, the process of which may be simplified and the reliability of which may be improved.

Additional features of the invention will be set forth in the description which follows, and in part will be apparent from the description, or may be learned by practice of the invention.

An exemplary embodiment of the present invention discloses a light-emitting diode (LED) including a substrate, a semiconductor stack arranged on the substrate, the semiconductor stack including an upper semiconductor layer having a first conductivity type, an active layer, and a lower semiconductor layer having a second conductivity type, isolation trenches separating the semiconductor stack into a plurality of regions, connectors disposed between the substrate and the semiconductor stack, the connectors electrically connecting the plurality of regions to one another, and a distributed Bragg reflector (DBR) with a multi-layered structure, the DBR disposed between the semiconductor stack and the connectors. In the LED, the connectors are electrically connected to the semiconductor stack through the DBR, and portions of the DBR are disposed between the isolation trenches and the connectors.

An exemplary embodiment of the present invention also discloses a method of fabricating a light-emitting diode (LED), the method including forming a semiconductor stack on a first substrate, the semiconductor stack including a first conductivity type semiconductor layer, is an active layer, and a second conductivity type semiconductor layer, patterning the semiconductor stack to form connection trenches to expose the first conductivity type semiconductor layer, wherein the connection trenches are separated from one another, forming a distributed Bragg reflector (DBR) with a multi-layered structure on the semiconductor stack, wherein the DBR has openings exposing the second conductivity type semiconductor layer and openings exposing the first conductivity type semiconductor layer, forming connectors to electrically connect a plurality of regions to one another; forming a separation insulating layer to cover the connectors, bonding a second substrate on the separation insulating layer, exposing the first conductivity type semiconductor layer by removing the first substrate, and patterning the semiconductor stack to expose the DBR, wherein patterning the semiconductor stack forms isolation trenches separating the plurality of regions from one another.

An exemplary embodiment of the present invention also discloses a light-emitting diode (LED) including a substrate, a first light emitting cell and a second light emitting cell, each of the first light emitting cell and the second light emitting cell including an upper semiconductor layer having a first conductivity type, an active layer, and a lower semiconductor layer having a second conductivity type, an intermediate insulating layer disposed between the substrate and the first and second light emitting cells, the intermediate insulating layer being a distributed Bragg reflector (DBR) having alternately stacked insulating layers, wherein the refractive indices of the alternately stacked insulating layers are different from each other, a transparent ohmic contact layer disposed between the intermediate insulating layer and the light emitting cells, the transparent ohmic contact layer contacting the lower semiconductor layer of each of the first and second light emitting cells, and a connector electrically connecting the upper semiconductor layer of the first light emitting cell and the transparent ohmic contact layer.

An exemplary embodiment of the present invention also discloses a method of fabricating a light-emitting diode (LED), the method including growing a first conductivity type semiconductor layer, an active layer, and a second conductivity type semiconductor layer on a first substrate, forming transparent ohmic contact layers on the second conductivity type semiconductor layer, the transparent ohmic contact layers being spaced apart from each other, alternately stacking insulating layers on the transparent ohmic contact layers to form an intermediate insulating layer of a distributed Bragg reflector (DBR), the alternately stacked insulating layers comprising different refractive indices from each other, the DBR to cover the transparent ohmic contact layers, coupling a second substrate on the intermediate insulating layer, removing the first substrate to expose the first conductivity type semiconductor layer, forming a cell separation region to define a first light emitting cell and a second light emitting cell by etching the first conductivity type semiconductor layer, the active layer, and the second conductivity type semiconductor layer, wherein a portion of the transparent ohmic contact layer is exposed in the cell separation region, forming a first insulating layer to cover a portion of side surfaces of the first and second light emitting cells, and forming a connector to electrically connect the first conductivity type semiconductor layer of the first light emitting cell to the exposed portion of the transparent ohmic contact layer.

A light-emitting diode (LED), including a substrate, a semiconductor stack arranged on the substrate, isolation trenches separating the semiconductor stack into a plurality of regions, and connectors disposed between the substrate and the semiconductor stack, the connectors electrically connecting the plurality of regions to one another in a first serial array and a second serial array, wherein the first serial array and the second serial array are connected in reverse parallel, the first serial array to emit light during a first half period of alternating current (AC) power and the second serial array to emit light during a second half period of AC power.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

FIG. 6d is an equivalent circuit diagram of FIG. 6a.

DETAILED DESCRIPTION OF THE ILLUSTRATED EMBODIMENTS

Figure 1:
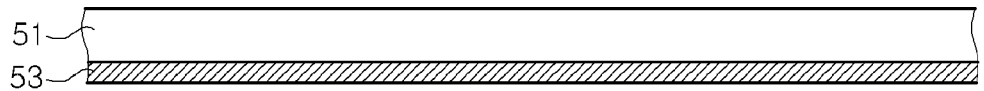
FIG. 1, FIG. 2, FIG. 3, and FIG. 4 are sectional views illustrating a method of fabricating a light emitting diode (LED) according to a related art.
Figure 1:
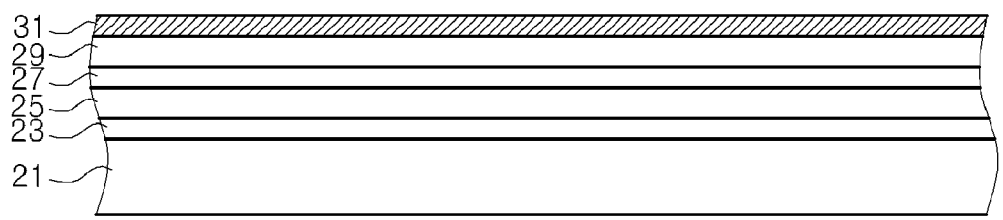
Figure 2:
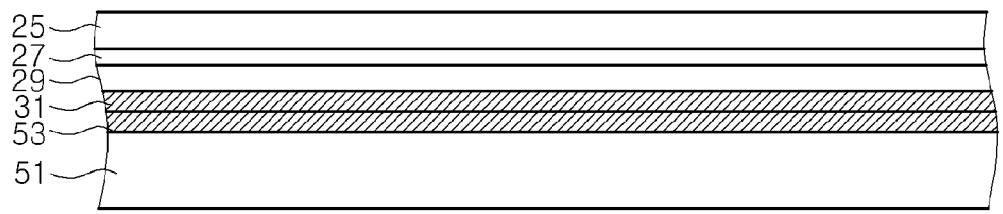
Figure 3:
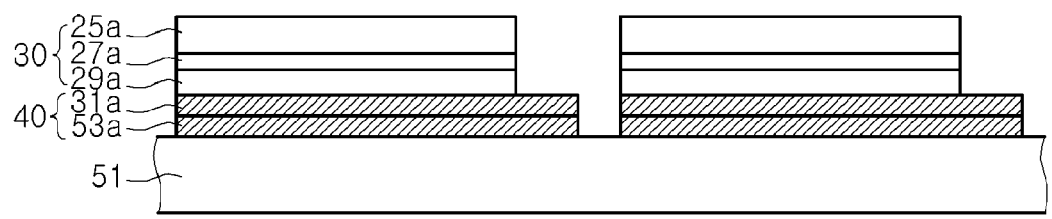
Figure 4:
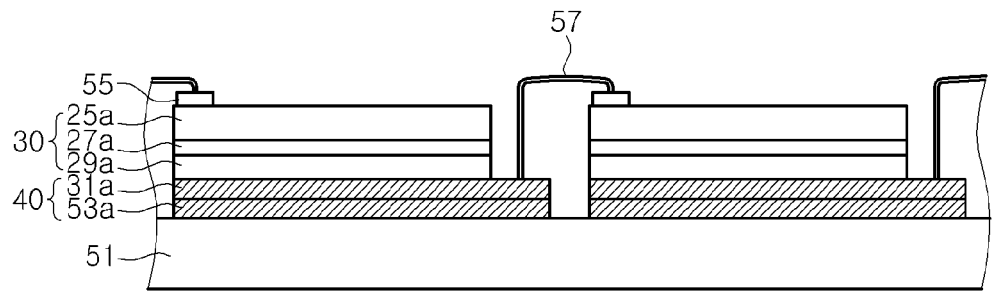
Figure 5:
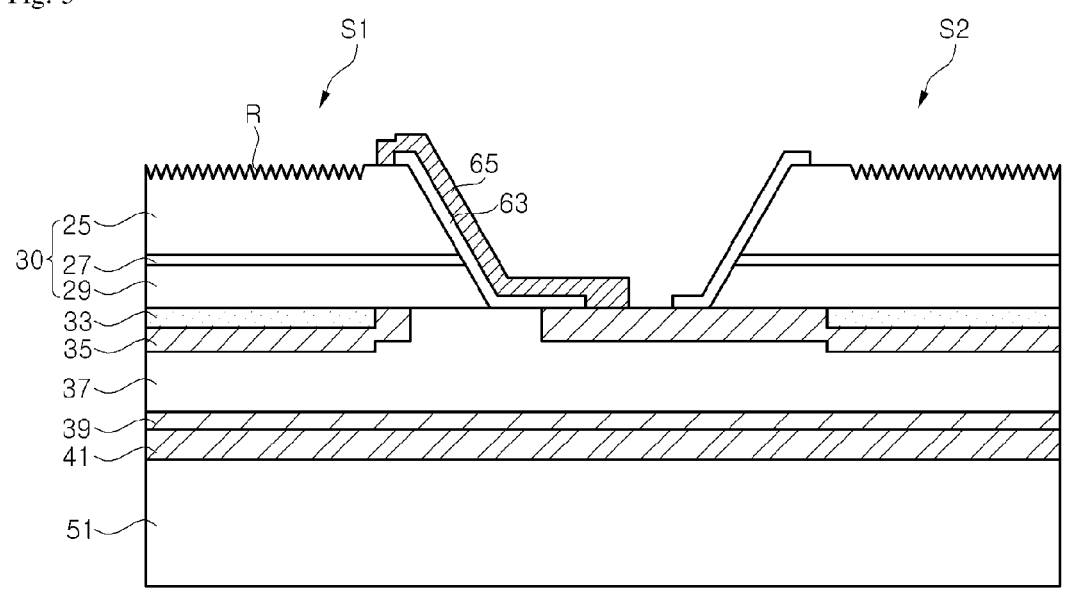
FIG. 5 is a sectional view illustrating an LED according to a related art.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

Figure 6A:
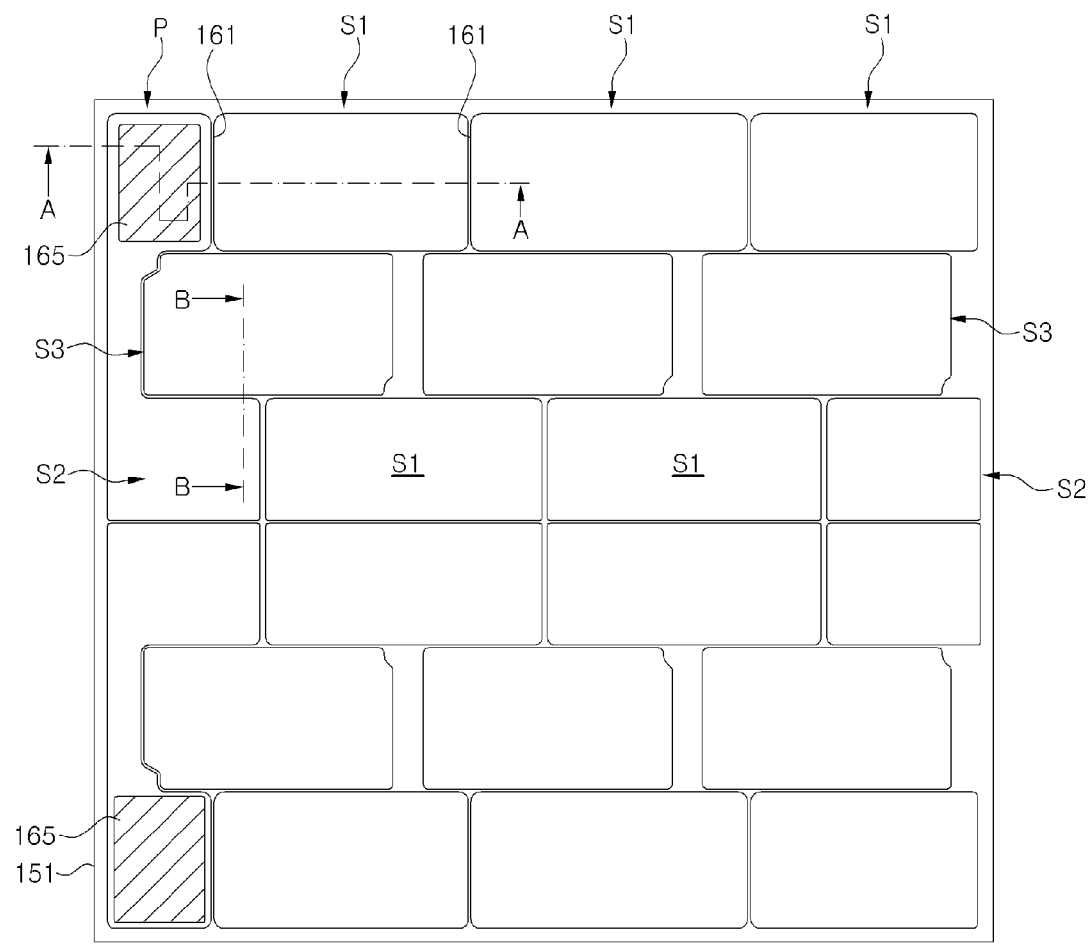
FIG. 6a is a plan view illustrating an LED according to an exemplary embodiment of the present invention.
Figure 6B:
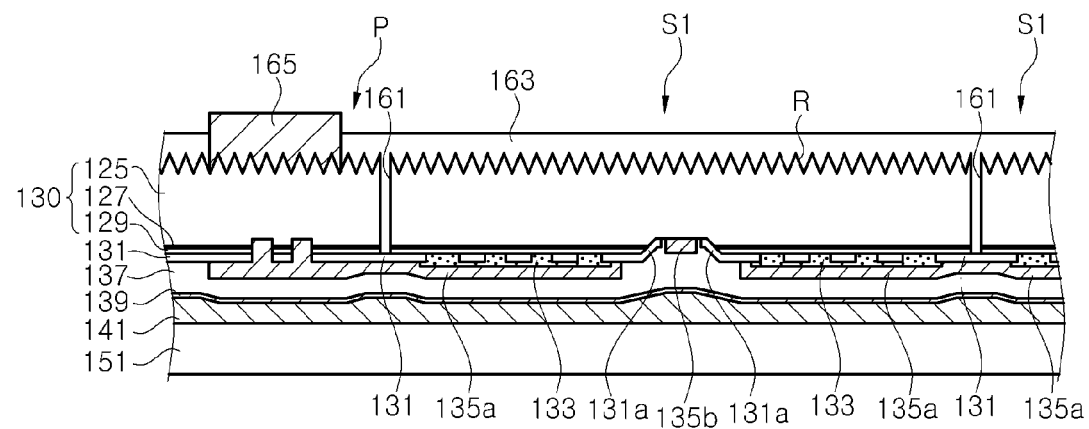
FIG. 6b and FIG. 6c are sectional views taken along lines A-A and B-B of FIG. 6a, respectively.
Figure 6C:
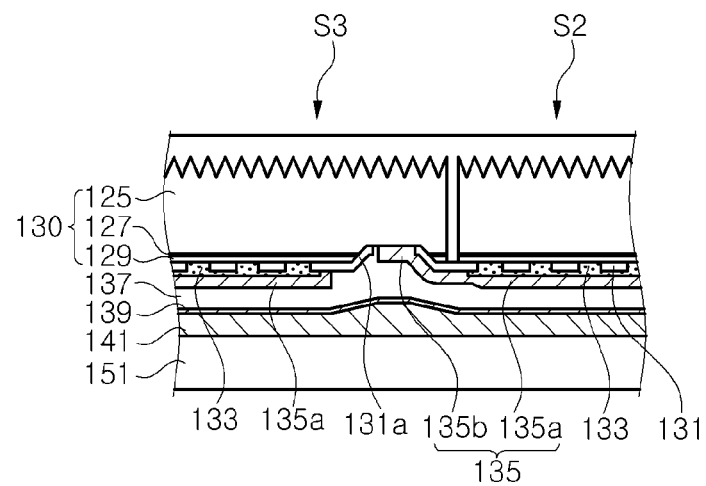
Figure 6D:
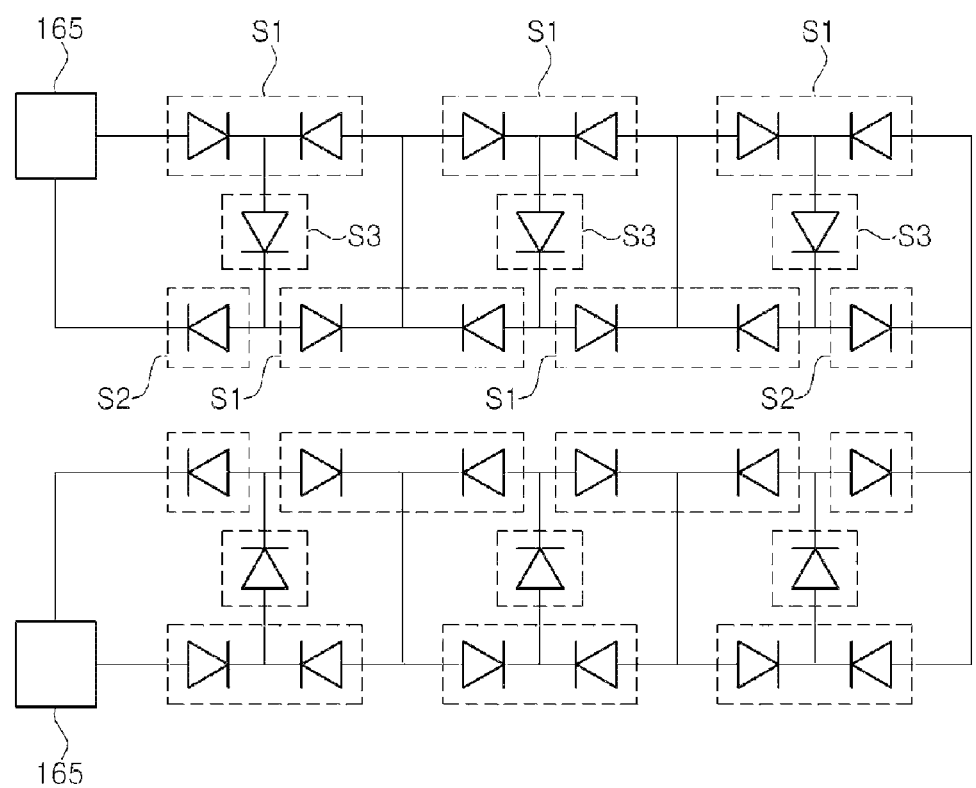

FIG. 6a is a plan view illustrating an LED according to an exemplary embodiment of the present invention. FIGS. 6b and 6c are sectional views respectively taken along lines A-A and B-B of FIG. 6a, for illustrating the LED according to the exemplary embodiment of the is present invention. FIG. 6d is an equivalent circuit diagram of FIG. 6a. In the present exemplary embodiment, an LED with a mirror symmetric structure has been described, but the present invention is not limited thereto.

Referring to FIGS. 6a, 6b, 6c and 6d, the LED includes a substrate 151, a semiconductor stack 130, isolation trenches 161, connectors 135, 135a and 135b, and a distribution Bragg reflector (DBR) 131 and 131a. The LED may further include an ohmic contact layer 133, a separation insulating layer 137, an adhesive layer 139, a bonding metal 141, a protective insulating layer 163, and electrode pads 165.

The substrate 151 is distinguished from a growth substrate for growing compound semiconductor layers, and is a substrate attached to the compound semiconductor layers which have been previously grown. Although the substrate 151 may be a sapphire substrate, the present invention is not limited thereto. That is, the substrate 151 may be another kind of insulating or conductive substrate. Particularly, if a sapphire substrate is used as the growth substrate for the semiconductor layers, the substrate 151 may be a sapphire substrate. Forming the substrate 151 from the same material as the growth substrate means these have the same thermal expansion coefficient as, which may be advantageous in view of the processes of bonding the substrate 151 and separating the growth substrate.

The semiconductor stack 130 is divided into a plurality of regions S1, S2, S3 and P by the isolation trenches 161. The semiconductor stack 130 includes a first conductivity type upper semiconductor layer 125, an active layer 127 and a second conductivity type lower semiconductor layer 129. The active layer 127 is interposed between the upper and lower semiconductor layers 125 and 129. Meanwhile, in each of the regions S1, S2 and S3, the active layer 127 and the lower semiconductor layer 129 are positioned so that a partial region of the upper semiconductor layer 125 is exposed downward. That is, the upper semiconductor layer 125 has a width greater than a width of the active layer 127 and the lower semiconductor layer 129.

The active layer 127 and the upper and lower semiconductor layers 125 and 129 may be formed of a III-Nitride-based compound semiconductor, e.g., (Al, Ga, In)N semiconductor. Each of the upper and lower semiconductor layers 125 and 129 may have a single- or multi-layered structure. For example, the upper semiconductor layer 125 and/or the lower semiconductor layer 129 may include a contact layer and a clad layer, and may further include a superlattice layer. In addition, the active layer 27 may have a single or multiple quantum well structure. The first conductivity type may be an n-type and the second conductivity type may be a p-type. Since the upper semiconductor layer 125 may be formed with an n-type semiconductor layer whose resistance is relatively low, the thickness of the upper semiconductor layer 125 may be relatively thick. Thus, it may be easy to form a roughened upper surface R of the upper semiconductor layer 125, wherein the roughened surface R may enhance the light extraction efficiency of the light generated in the active layer 127.

Meanwhile, in the present exemplary embodiment, the regions S1 have a common light emitting cell. The term "common light emitting cell" means that a plurality of light emitting cells share a first or second conductivity type semiconductor layer. Here, the regions S1 have a common light emitting cell that shares the first conductivity type upper semiconductor layer 125 as shown in FIG. 6b. Meanwhile, each of the regions S2 and S3 has a single light emitting cell. In other exemplary embodiments, each of the regions S1, S2, and S3 may have a single light emitting cell.

The regions P are also separated by the isolation trenches. The electrode pads 165 are formed on the regions P, respectively. The electrode pads 165 are connected to an external power source so as to receive power. A wire (not shown) may be bonded to each of the electrode pads 165. The regions P may be connected to the regions S2, respectively. That is, the regions P and S2 may share at least one of the semiconductor layers, particularly, the first conductivity type upper semiconductor layer 125. The regions P have connection trenches (or holes) 130b (see FIGS. 7 and 8) that pass through the second conductivity type lower semiconductor layer 129 and the active layer 127. The isolation trenches 161 pass through the semiconductor stack 130 to separate the semiconductor stack 130 into the plurality of regions S1, S2, S3, and P. In some embodiments, some of the isolation trenches 161 may not pass through the active layer 127 and the lower semiconductor layer 129. Thus, no side surfaces of the active layer 127 and the lower semiconductor layer 129 may be exposed in some of the inner walls of the isolation trenches 161. Alternatively, all of the isolation trenches 161 may be configured to pass through the upper semiconductor layer 125, the active layer 127 and the lower semiconductor layer 129. Thus, the inner walls of the isolation trenches 161 may be formed with the semiconductor stack 130 including the upper semiconductor layer 125, the active layer 127, and the lower semiconductor layer 129. In that embodiment, since all of the isolation trenches 161 may be formed to have the same depth, it is possible to promote the stabilization of an etching process for forming the isolation trenches 161.

Meanwhile, the connectors 135 electrically connect the regions S1, S2, S3, and P separated by the isolation trenches 161. Since the connectors 135 are positioned between the semiconductor stack 130 and the substrate 151, light emitted from a light emitting surface is not blocked by the connectors 135. The connectors 135 have contact portions 135a electrically connected to the second conductivity type lower semiconductor layers 129 of the semiconductor stack 130 and contact portions 135b connected to the first conductivity type upper semiconductor layers 125 of the semiconductor stack 130.

For example, as shown in FIG. 6b, each region S1 having the common light emitting cell has contact portions 135a connected to the lower semiconductor layer 129 and a contact portion 135b connected to the upper semiconductor layer 125. As shown in FIG. 6c, each of the regions S2 and S3 having single light emitting cells has a contact portion 135a connected to the lower semiconductor layer 129 and a contact portion 135b connected to the upper semiconductor layer 125. Further, each of the pad regions P has contact portions 135a connected to the lower semiconductor layer 129. The contact portion 135a in the pad region P is electrically connected to the upper semiconductor layer 125 through the holes 130b (see FIGS. 7 and 8).

Meanwhile, on a first row, the contact portions 135a in regions S1 except regions S1 positioned at both outermost sides on the first row are connected to the contact portions 135a in adjacent regions S1, respectively. The contact portion 135a of region S1 adjacent to the pad region P is connected to the contact portion 135a in the pad region P.

The contact portion 135a in the right outermost region S1 on the first row is connected to the contact portion 135b connected to the upper semiconductor layer 125 in the right outermost region S2 on a third row. The contact portions 135b connected to the regions S1 on the third row are connected to the contact portions 135a in the regions S1 on the first row, respectively.

Meanwhile, the contact portions 135a in the regions S3 on a second row are connected to the contact portions 135b on the first row, respectively, and each of the contact portions 135b in the regions S3 on the second row is connected to two contact portions 135a on the third row.

Through the connectors 135, an LED having an equivalent circuit diagram as shown in FIG. 6d may be provided.

Referring to FIG. 6d, serial arrays of light emitting cells are formed by the connectors 135. These serial arrays are connected in reverse parallel between the electrode pads 165. Thus, the LED can be driven by connecting an AC power source to the electrode pads 165. Here, a forward voltage is applied to the light emitting cells in some regions S1 and S2 during one half period of AC power, and a reverse voltage is applied to the light emitting cells in some regions S1 and S2 during the other half period of the AC power. On the other hand, the forward voltage is applied to the light emitting cells in the regions S3 during the whole period of the AC power. Thus, the effective light emitting area can be increased due to the full-wave light emitting cells (i.e., regions S3) which may emit light over the whole period in which the phase of the AC power is changed. According to the present invention, the reverse voltage applied to one full-wave light emitting cell has the same value as the forward voltage applied to two half-wave light emitting cells (i.e., S1 and S2).

Referring back to FIGS. 6b and 6c, the DBR 131 and 131a having a multi-layered structure is interposed between the connectors 135 and the semiconductor stack 130. The DBR 131 and 131a reflects the light which is generated in the active layer 127 and is emitted toward the substrate 151, thereby enhancing the light emission efficiency of the LED. The DBR 131 is positioned beneath the lower semiconductor layer 129 in each of the regions S1, S2, and S3 while the DBR 131a covers side surfaces of the lower semiconductor layer 129 and the active layer 127. Particularly, the DBR 131a covers the side surfaces of the active layer 127 and the lower semiconductor layer 129 so as to prevent the upper and lower semiconductor layers 125 and 129 from being short-circuited by the connectors 135. Meanwhile, the DBR 131 is also positioned beneath the bottom of the isolation trench 161. The DBR 131 is positioned between the connectors 135 and the isolation trenches 161 so as to prevent the connectors 135 from being exposed to the outside when the isolation trenches 161 are formed.

The DBR 131 and 131a may be formed by alternately stacking two layers whose refractive indices are different from each other. For example, the DBR 131 and 131a may be formed by alternately stacking $SiO_2/TiO_2$ or $SiO_2/Nb_2O_5$. The DBR 131 and 131a has openings through which the lower semiconductor layer 129 is exposed and openings through which the upper semiconductor layer 125 is exposed.

Meanwhile, the connectors 135, particularly contact portions 135a, may be electrically connected to the lower semiconductor layer 129 through the DBR 131, i.e., through the openings of the DBR 131, and may be also electrically connected to the upper semiconductor layer 125 through the openings of the DBR 131a. The ohmic contact layer 133 may come in contact with the lower semiconductor layer 129 through the DBR 131, and the connectors 135, i.e., the contact portions 135a may be connected to the ohmic contact layer 133. The ohmic contact layer 133 may be formed of a reflective layer such as Ag or Al, or a transparent conductive layer such as Ni/Au, indium tin oxide (ITO), ZnO, or other transparent conducting oxide (TCO). If the ohmic contact layer 133 is formed of a metallic reflective layer such as Ag or Al, the contact portions 135a can surround the ohmic contact layer 133 to protect the ohmic contact layer 133.

Meanwhile, the bonding metal 141 may be interposed between the semiconductor stack 130 and the substrate 151. The bonding metal 141 is a metallic material for bonding the substrate 151 on the semiconductor stack 130, and may be formed of Au/Sn. The separation insulating layer 137 may be interposed between the semiconductor stack 130 and the bonding metal 141 so as to separate the connectors 135 from the bonding metal 141.

Meanwhile, the adhesive layer 139 such as Cr/Au may be formed below the separation insulating layer 137 so as to improve the adhesion of the bonding metal 141.

Meanwhile, the upper semiconductor layer 125 may have the roughened surface R. Further, the protective insulating layer 163 may cover the semiconductor stack 130 so as to protect the light emitting cells. The isolation trenches 161 may be filled with the protective insulating layer 163.

FIGS. 7 to 13 are sectional views illustrating a method of fabricating an LED according to an exemplary embodiment of the present invention, wherein "a" and "b" of each of FIGS. 7 to 13 correspond to sectional views taken along lines A-A and B-B of FIG. 6a, respectively.

Figure 7A:
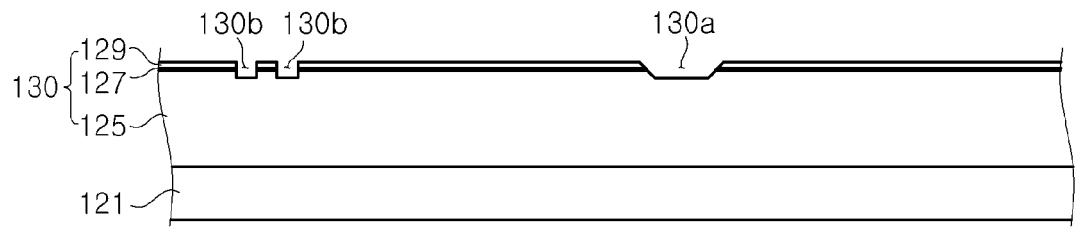
FIG. 7, FIG. 8, FIG. 9, FIG. 10, FIG. 11, FIG. 12, and FIG. 13 are sectional views illustrating a method of fabricating an LED according to an exemplary embodiment of the present invention, wherein "a" and "b" of each of FIG. 7, FIG. 8, FIG. 9, FIG. 10, FIG. 11, FIG. 12, and FIG. 13 correspond to sectional views taken along lines A-A and B-B of FIG. 6a, respectively.
Figure 7B:
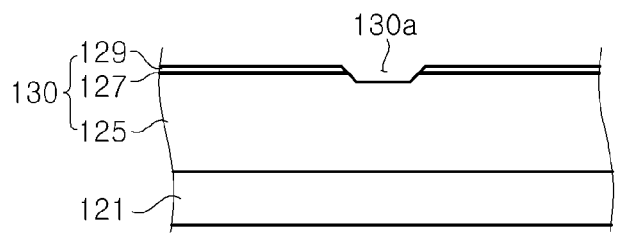

Referring to FIGS. 7a and 7b, a semiconductor stack 130 of compound semiconductor layers is formed on a sacrificial substrate 121. The sacrificial substrate 121 may be a sapphire substrate, but the present invention is not limited thereto. That is, the sacrificial substrate may be a heterogeneous substrate which is different from the sapphire substrate. Meanwhile, the compound semiconductor layers include a first conductivity type semiconductor layer 125, a second conductivity type semiconductor layer 129 and an active layer 127 interposed therebetween. The first conductivity type semiconductor layer 125 is positioned close to the sacrificial substrate 121. Each of the first and second conductivity type semiconductor layers 125 and 129 may be formed to have a single- or multi-layered structure. The active layer 127 may be formed to have a single or multiple quantum well structure.

The compound semiconductor layers may be formed of III-Nitride based compound semiconductors, and may be grown on the sacrificial substrate 121 using a process such as metal-organic chemical vapor deposition (MOCVD) or molecular beam epitaxy (MBE).

Meanwhile, a buffer layer (not shown) may be formed before the compound semiconductor layers are formed. The buffer layer is employed to reduce the lattice misalignment between the sacrificial substrate 121 and the compound semiconductor layers, and may be a GaN-based material layer, such as GaN or AlN.

The semiconductor stack 130 is patterned to form connection trenches 130a and 130b for exposing the first conductivity type semiconductor layer 125. The connection trenches 130a are formed to expose the first conductivity type semiconductor layer 125 to which the connectors 135 of FIGS. 6b and 6c are connected. The first conductivity type semiconductor layer 125 in each of the regions S1, S2, and S3 of FIG. 6a is exposed by the connection trenches 130a. Side surfaces of the active layer 127 and the second conductive type semiconductor layer 129 are exposed to sidewalls of the connection trenches 130a.

The compound semiconductor layers may be patterned using a photolithography process so as to form the connection trenches 130a and 130b, wherein such a process may be similar to a mesa etching process. However, while the connection trenches in the mesa etching process are connected to one another, the connection trenches 130a in the present invention are separated from one another. Accordingly, the area of the connection trenches 130a can be reduced, and thus it may be possible to easily planarize a separation insulating layer and a bonding metal later. As a result, a substrate can be stably attached to the semiconductor stack.

Meanwhile, the connection trenches (holes) 130b are formed in regions in which electrode pads are formed, wherein a plurality of connection trenches 130b is formed in each of the regions.

Figure 8A:
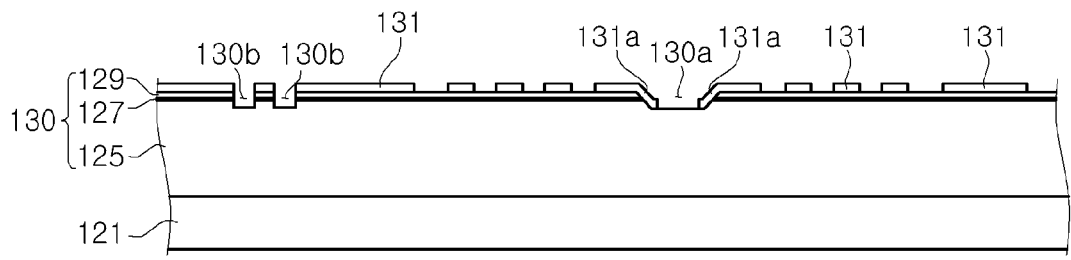
Figure 8B:
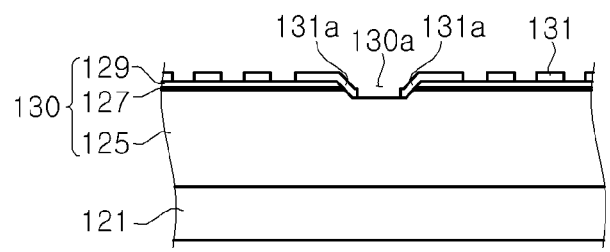

Referring to FIGS. 8a and 8b, DBRs 131 and 131a are formed on the semiconductor stack 130. The DBR 131 and 131a has openings through which the second conductivity type lower semiconductor layer 129 is exposed, and openings through which the first conductivity type upper semiconductor layer 125 is exposed. The DBR 131 and 131a may be formed by using a lift-off process or by alternately stacking two layers whose refractive indices are different from each other and then patterning them so as to expose the second conductivity type semiconductor layer 129 and the first conductivity type semiconductor layer 125 in the connection trenches 130a and 130b.

The DBR 131 is formed on the second conductivity type semiconductor layer 129, and also formed in regions in which isolation trenches (161 of FIGS. 6b and 6c) will be formed later. Meanwhile, the DBR 131a covers side surfaces of the active layer 127 and the second conductivity type semiconductor layer 129, which are exposed by the connection trenches 130a. The DBR 131a is formed so as to prevent the first and second conductivity type semiconductor layers from being short-circuited by the connectors 135.

The DBR 131 may be formed by alternately stacking two layers, e.g., $SiO_2/TiO_2$ or $SiO_2/Nb_2O_5$, whose refractive indices are different from each other. In this case, the first and last layers of the DBR 131 are formed of $SiO_2$, so that it is possible to prevent cracks from being formed in the DBR 131 and 131a and to protect the DBR 131.

Figure 9A:
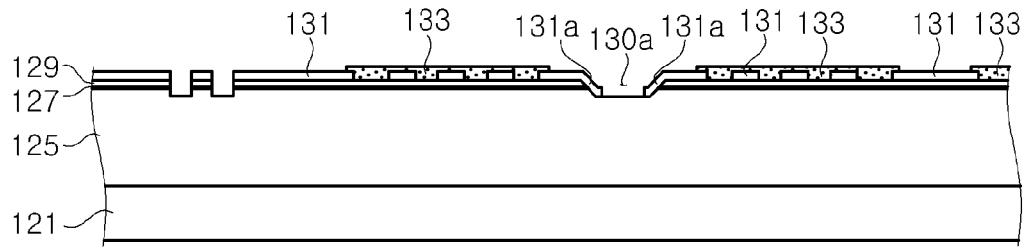
Figure 9B:
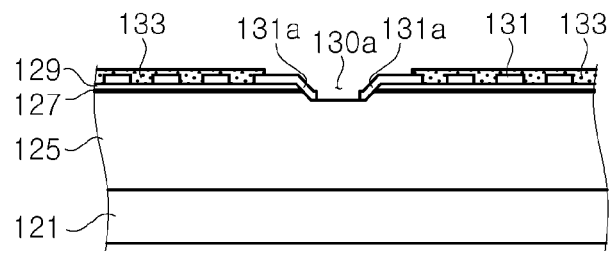

Referring to FIGS. 9a and 9b, an ohmic contact layer 133 is formed on the DBR 131. The ohmic contact layer 133 covers the openings in the DBR 131 to be connected to the second conductivity type semiconductor layer 129. The ohmic contact layer 133 may be formed of a reflective layer such as Ag or Al, or a transparent conductive layer such as Ni/Au, ITO, ZnO, or another TCO. If the ohmic contact layer 133 includes a reflective layer, it may reflect light together with the DBR 131. If the ohmic contact layer 133 is formed of TCO, it may have a stable contact resistance characteristic.

Figure 10A:
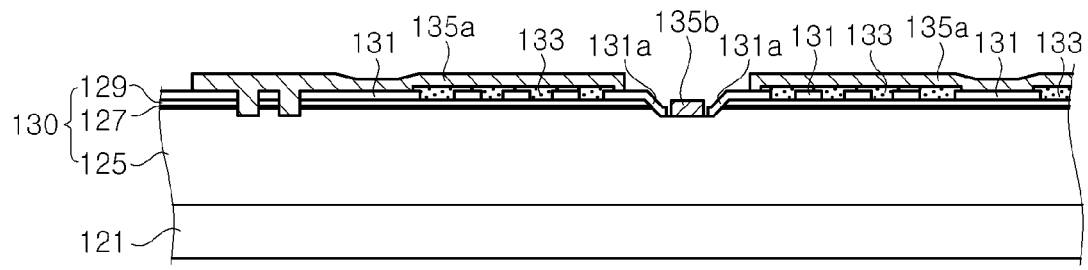
Figure 10B:
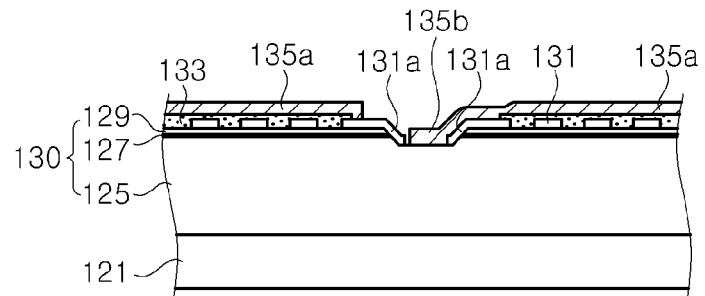

Referring to FIGS. 10a and 10b, contact portions 135a for covering the ohmic contact layer 133 and contact portions 135b connected to the first conductivity type semiconductor layer 125 are formed. These contact portions are connected to one another so as to constitute connectors 135 for connecting light emitting cells to one another. The connectors 135 may electrically connect the second conductivity type semiconductor layers 129 to one another or may electrically connect the first and second conductivity type semiconductor layers 125 and 129. The contact portions 135a may surround and cover the ohmic contact layer 133.

Figure 11A:
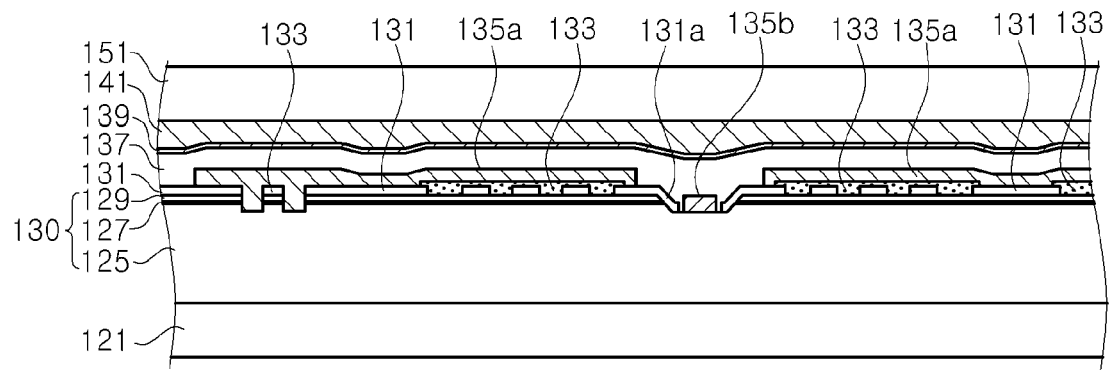
Figure 11B:
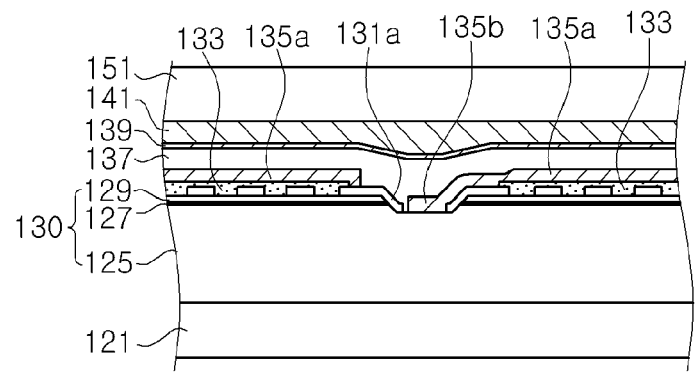

Referring to FIGS. 11a and 11b, a separation insulating layer 137 is formed on almost the entire surface of the sacrificial substrate 121 on which the connectors 135 are formed. The separation insulating layer 137 covers the connectors 135 and the semiconductor stack 130. The separation insulating layer 137 may be formed of a silicon oxide layer, a silicon nitride layer, or similar material. An adhesive layer 139 may be formed on the separation insulating layer 137. A bonding metal 141 may be formed on the adhesive layer 139, and a substrate 151 may be bonded thereto. The bonding metal 141 may be formed of AuSn (80/20 wt %), for example. The substrate 151 may be a substrate having the same refractive index as the sacrificial substrate 121.

Figure 12A:
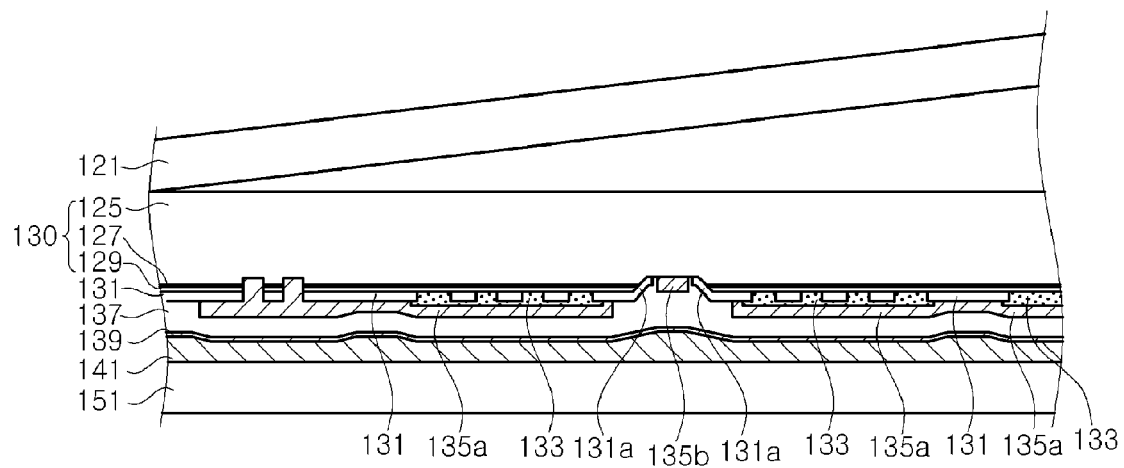
Figure 12B:
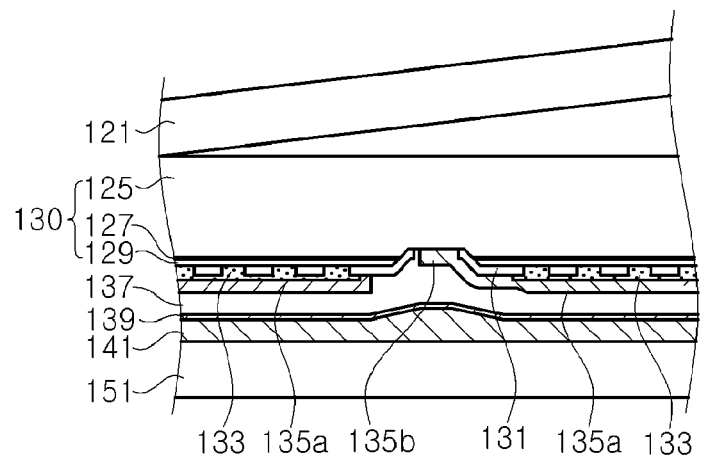

Referring to FIGS. 12a and 12b, subsequently, the sacrificial substrate 121 is removed, and the first conductivity type semiconductor layer 125 is exposed. The sacrificial substrate 121 may be separated using a laser lift-off (LLO) technique or another mechanical or chemical method. At this time, the buffer layer is also removed so that the first conductivity type semiconductor layer 125 is exposed.

Figure 13A:
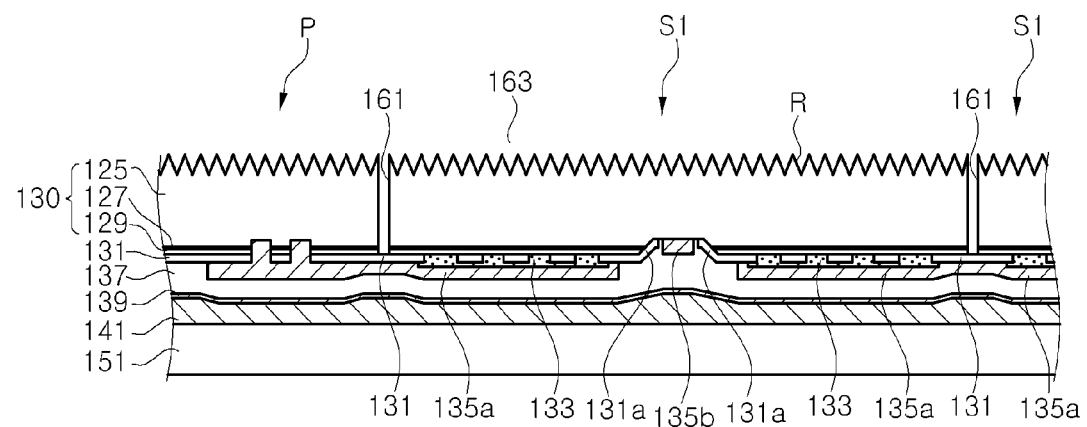
Figure 13B:
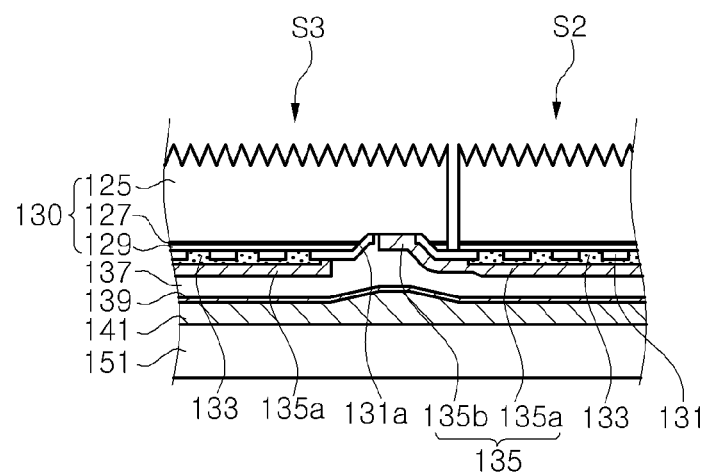

Referring to FIGS. 13a and 13b, isolation trenches 161 for separating the exposed first conductivity type semiconductor layer 125 into a plurality of regions S1, S2, S3, and P are formed. The isolation trenches 161 separate the semiconductor stack 130 into light emitting cell regions or common light emitting cell regions. The isolation trenches 161 are formed by etching the semiconductor stack 130 until the DBR 131 or 131a is exposed. The DBR 131 prevents the connectors 135 from being exposed. Sidewalls of the isolation trenches 161 are formed with the semiconductor stack 130, and side surfaces of the first conductivity type semiconductor layer 125, the active layer 127, and the second conductivity type semiconductor layer 129 are exposed in the isolation trenches 161. Meanwhile, a roughened surface R may be formed on the first conductivity type semiconductor layer 125 using photo-enhanced chemical (PEC) etching, or the like.

Although it has been described that the DBR 131 or 131a is exposed when the isolation trenches 161 are formed, another insulating pattern besides the DBR may be formed in the region in which the isolation trenches 161 are formed.

Meanwhile, a protective insulating layer 163 and electrode pads 165 are formed on the first conductivity type semiconductor layer 125, and the substrate 151 is separated on a LED basis in which the plurality of regions S1, S2, S3, and P are included, thereby completing a single-chip LED.

Figure 14:
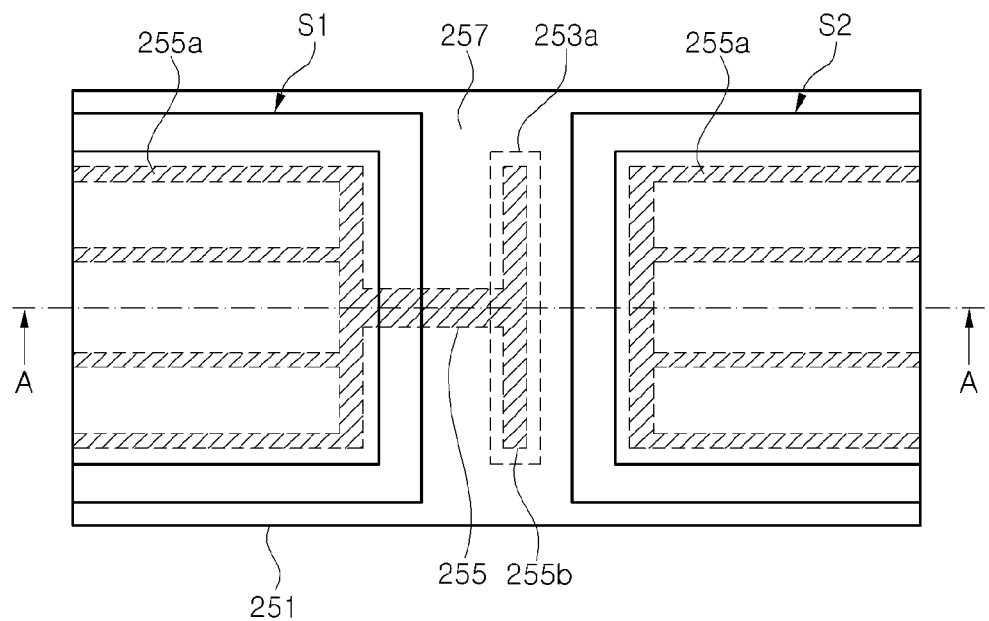
FIG. 14 is a schematic plan view illustrating an LED according to an exemplary embodiment of the present invention.
Figure 15:
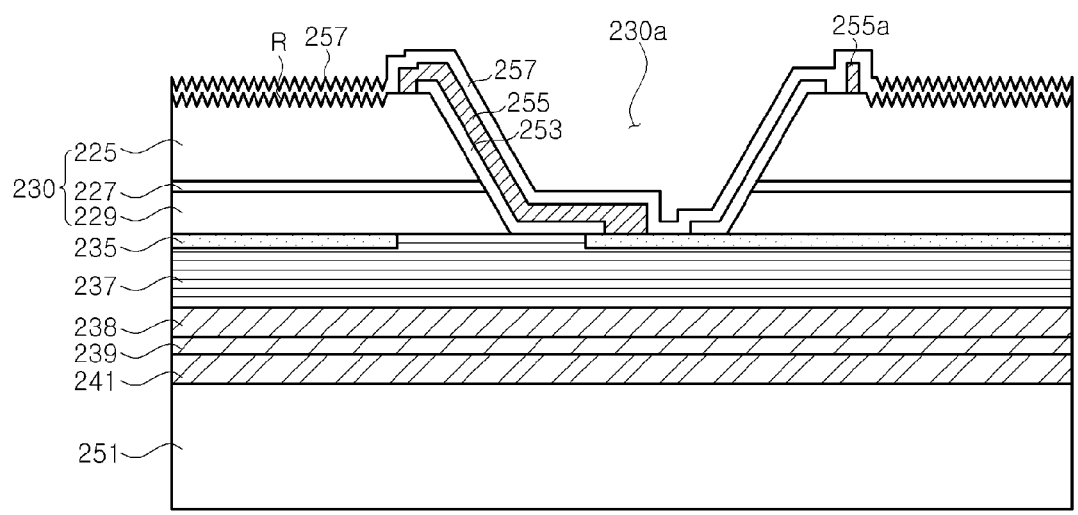
FIG. 15 is a sectional view taken along line A-A of FIG. 14.

FIG. 14 is a schematic plan view illustrating an LED according to an exemplary embodiment of the present invention. FIG. 15 is a sectional view taken along line A-A of FIG. 14.

Referring to FIGS. 14 and 15, the LED includes a substrate 251, first and second light emitting cells S1 and S2, an intermediate insulating layer 237, transparent ohmic contact layers 235 and a connector 255. The LED may include a reflective metal layer 238, an adhesive layer 239 and a bonding metal 241, and may further include a first insulating layer 253 and a second insulating layer 257.

The substrate 251 is distinguished from a growth substrate for growing compound semiconductor layers, and is a substrate attached to the compound semiconductor layers which have been previously grown. The substrate 251 may be variously selected, and particularly may be a substrate made of a material with high thermal conductivity, e.g., Si, SiC, AlN, or a metallic material, so as to improve its heat dissipation property. However, the substrate is not particularly limited but may be another kind of insulating or conductive substrate. Particularly, if a sapphire substrate is used as the growth substrate for the semiconductor layers, the substrate 251 may be a sapphire substrate so as to have the same thermal expansion coefficient as the growth substrate.

The light emitting cells S1 and S2 are separated by a cell separation region 230a. Each of the light emitting cells S1 and S2 includes a semiconductor stack 230 having a first conductivity type upper semiconductor layer 225, an active layer 227 and a second conductivity type lower semiconductor layer 229. The active layer 227 is interposed between the upper and lower semiconductor layers 225 and 229. Meanwhile, the cell separation region 230a separates the light emitting cells S1 and S2 from each other by passing through the upper semiconductor layer 225, the active layer 227 and the lower semiconductor layer 229.

The active layer 227 and the upper and lower semiconductor layers 225 and 229 may be formed of a III-Nitride-based compound semiconductor, e.g., (Al, Ga, In)N semiconductor. Each of the upper and lower semiconductor layers 225 and 229 may have a single- or multi-layered structure. For example, the upper semiconductor layer 225 and/or the lower semiconductor layer 229 may include a contact layer and a clad layer, and may further include a superlattice layer. In addition, the active layer 227 may have a single or multiple quantum well structure. Preferably, the first conductivity type is an n-type and the second conductivity type is a p-type.

Since the upper semiconductor layer 225 is formed with an n-type semiconductor layer whose resistance is relatively low, the thickness of the upper semiconductor layer 225 can be relatively thick. Thus, it may be easy to form a roughened top surface R of the upper semiconductor layer 225, wherein the roughened surface R enhances the light extraction efficiency of the light generated in the active layer 227.

The intermediate insulating layer 237 is positioned between the substrate 251 and the light emitting cells S1 and S2 so as to insulate the light emitting cells S1 and S2 from the substrate 251 or the bonding metal 241. The intermediate insulating layer 237 may be a DBR formed by alternately stacking material layers, e.g., $SiO_2/TiO_2$ or $SiO_2/Nb_2O_5$, whose refractive indices are different from each other.

The intermediate insulating layer 237 has a relatively high reflectance with respect to the light generated in the active layer 227. For example, if the active layer generates blue light, the intermediate insulating layer 237 is formed to have a high reflectance with respect to the light in a wavelength range of 400 nm to 500 nm. Since $SiO_2$ has a higher adhesion to a semiconductor layer than $TiO_2$ or $Nb_2O_5$, $SiO_2$ may be disposed as the first layer close to the light emitting cells S1 and S2.

Alternatively, the intermediate insulating layer 237 may be formed to have a high reflectance with respect to not only blue light but also green light and red light. For example, the intermediate insulating layer may be formed as a DBR having a reflectance of 95% or higher with respect to the wavelength region of blue, green and red light, and may have a reflectance of 98% or higher.

Meanwhile, the transparent ohmic contact layer 235 is interposed between the intermediate insulating layer 237 and each of the light emitting cells S1 and S2. The transparent is ohmic contact layer 235 may be formed of, for example, ITO or ZnO, and is ohmic-contacted with the lower semiconductor layer 229. As shown in FIG. 15, the transparent ohmic contact layer 235 at a lower portion of the second light emitting cell S2 may be extended toward the cell separation region 230a.

Meanwhile, the reflective metal layer 238 may be interposed between the substrate 251 and the intermediate insulating layer 237. If the light generated in the active layer 227 is transmitted through the intermediate insulating layer 237, it may be reflected by the reflective metal layer 238. Thus, it is possible to prevent the light from being lost (i.e., absorbed or dissipated) in the bonding metal 241 or the substrate 251. The reflective metal layer 238 may be formed of aluminum (Al), for example.

The substrate 251 may be bonded to the intermediate insulating layer 237 or the reflective metal layer 238 through the bonding metal 241. In order to improve the adhesion of the bonding metal 241, the adhesive layer 239 may be interposed between the bonding metal 241 and the intermediate insulating layer 237. The bonding metal 241 may be a metallic material for bonding the substrate 251 on the light emitting cells S1 and S2, and may be formed of Au/Sn. Meanwhile, the adhesive layer 239 may be formed of Cr/Au, for example.

Meanwhile, the connectors 255 electrically connect the upper semiconductor layer 225 of the first light emitting cell S1 to the transparent ohmic contact layer 235 at the lower portion of the second light emitting cell S2. For example, one end of the connector 255 comes in contact with the upper semiconductor layer 225 of the first light emitting cell S1, and the connector 255 is extended along a side surface of the first light emitting cell S1 from the one end. The other end of the connector 255 comes in contact with the transparent ohmic contact layer 235 extended toward the cell separation region 230a. Accordingly, the light emitting cells S1 and S2 are connected to each other in series through the connector 225. As shown in FIG. 14, an electrode extending portion 255a may be formed on each of the light emitting cells S1 and S2. The electrode extending portion 255a is formed to help the dispersion of current in each of the light emitting cells S1 and S2, and its structure is not particularly limited. An electrode extending portion 255b may be also formed on the transparent ohmic contact layer 235 so as to increase the contact surface that comes in contact with the transparent ohmic contact layer 235. The electrode extending portions 255a and 255b may be formed of the same material and through the same process as the connector 255.

Meanwhile, the first insulating layer 253 is interposed between the side surface of the first light emitting cell S1 and the connector 255, so as to prevent the upper semiconductor layer 225 and the lower semiconductor layer 229 from being electrically short-circuited by the connector 255. The first insulating layer 253 may be formed of $SiO_2$, for example.

The second insulating layer 257 may cover the first and second light emitting cells S1 and S2, the connector 255, and the first insulating layer 253. The second insulating layer 257 may also be formed along the roughened surface R of the upper semiconductor layer 225 so as to have an uneven shape. The second insulating layer 257 protects the LED from external environmental factors such as an external force or moisture. The second insulating layer 257 may be formed of $SiO_2$ or $Si_3N_4$.

In the present exemplary embodiment, only two light emitting cells S1 and S2 have been shown and illustrated. However, a larger number of light emitting cells may be arranged on the substrate 251, and these light emitting cells may be connected to each other in series, parallel, and/or in reverse parallel through a plurality of connectors 255. Further, a bridge rectifier circuit may be configured using the light emitting cells.

FIGS. 16 to 21 are sectional views illustrating a method of fabricating an LED according to an exemplary embodiment of the present invention.

Figure 16:
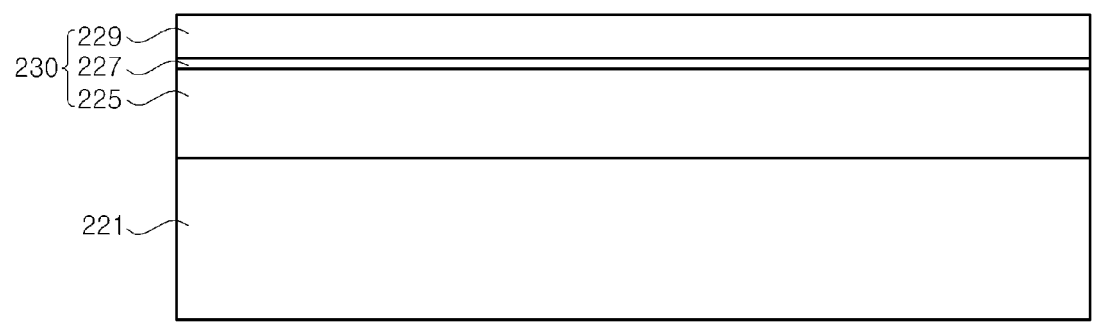
FIG. 16, FIG. 17, FIG. 18, FIG. 19, FIG. 20, and FIG. 21 are sectional views illustrating a method of fabricating an LED according to an exemplary embodiment of the present invention.

Referring to FIG. 16, a semiconductor stack 230 of compound semiconductor layers including a first conductivity type semiconductor layer 225, an active layer 227, and a second conductivity type semiconductor layer 229 is formed on a growth substrate 221. Although the growth substrate 221 may be a sapphire substrate, the present invention is not limited thereto. That is, the growth substrate may be a heterogeneous substrate which is different from the sapphire substrate. The first conductivity type semiconductor layer 225 is positioned close to the growth substrate 221. Each of the first and second conductivity type semiconductor layers 225 and 229 may be formed to have a single- or multi-layered structure. The active layer 227 may be formed to have a single or multiple quantum well structure.

The compound semiconductor layers may be formed of III-Nitride based compound semiconductors, and may be grown on the growth substrate 221 using a process such as an MOCVD or MBE.

Meanwhile, a buffer layer (not shown) may be formed before the compound semiconductor layers are formed. The buffer layer is employed to reduce the lattice misalignment between the growth substrate 221 and the compound semiconductor layers, and may be a GaN-based material layer, such as GaN or AlN.

Figure 17:
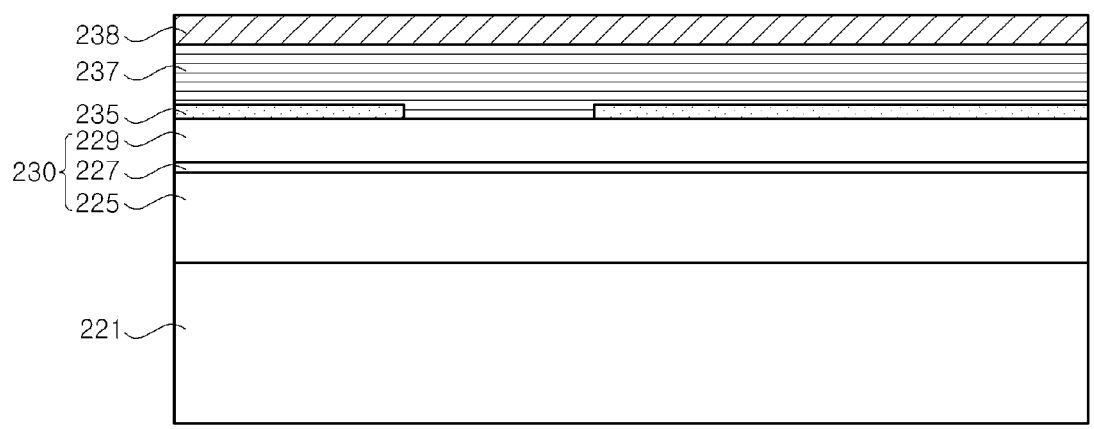

Referring to FIG. 17, transparent ohmic contact layers 235 which are spaced apart from each other are formed on the semiconductor stack 230. Each of the transparent ohmic contact layers 235 is formed to correspond to a light emitting cell region, wherein a portion of the transparent ohmic contact layer is formed to be extended outwards from the light emitting cell region. The transparent ohmic contact layer 235 may be formed of a TCO such as ITO or ZnO, for example. The transparent ohmic contact layer 235 is ohmic-contacted with the second conductivity type semiconductor layer 229.

Subsequently, an intermediate insulating layer 237 is formed to cover the transparent ohmic contact layers 235. The intermediate insulating layer 237 is formed to be a DBR formed by repeatedly stacking insulating layers whose refractive indices are different from each other. For example, the intermediate insulating layer 237 may be formed by repeatedly stacking $SiO_2/TiO_2$ or $SiO_2/Nb_2O_5$. A DBR with high reflectance throughout the wide wavelength range of blue, green, and red light can be formed by controlling the thickness of each of the insulating layers that constitute the intermediate insulating layer 237. Then, a reflective metal layer 238 may be formed on the intermediate insulating layer 237. The reflective metal layer 238 may be formed of Al, for example.

Figure 18:
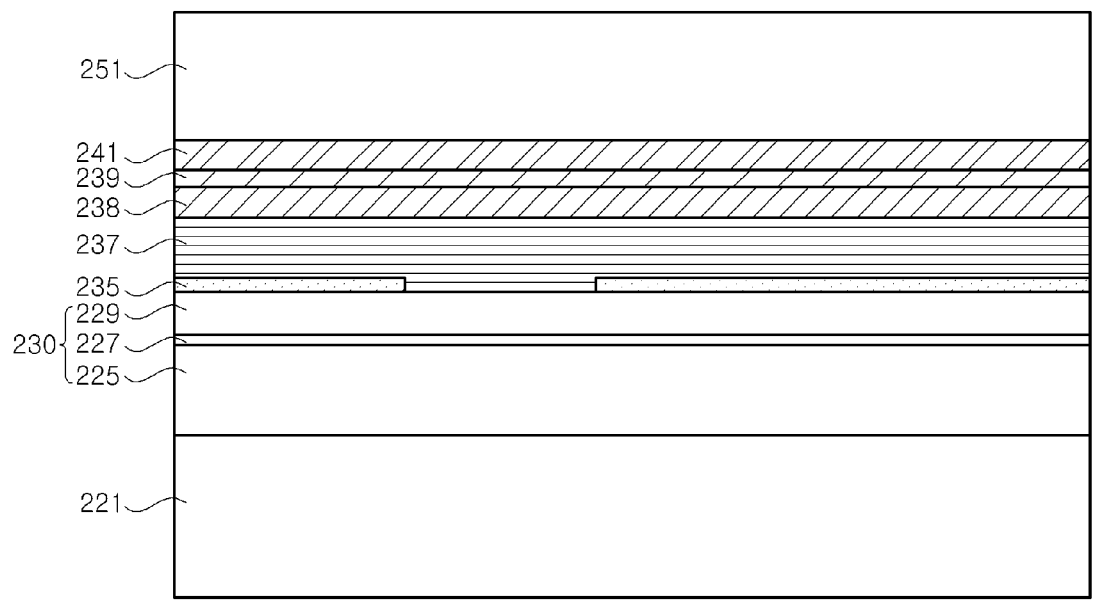

Referring to FIG. 18, an adhesive layer 239 may be formed on the reflective metal layer 238. Then, a bonding metal 241 is formed on the adhesive layer 239, and a secondary substrate 251 is bonded thereto. The adhesive layer 239 may be formed of, for example, Cr/Au, while the bonding metal 241 may be formed of, for example, AuSn (80/20 wt %).

Figure 19:
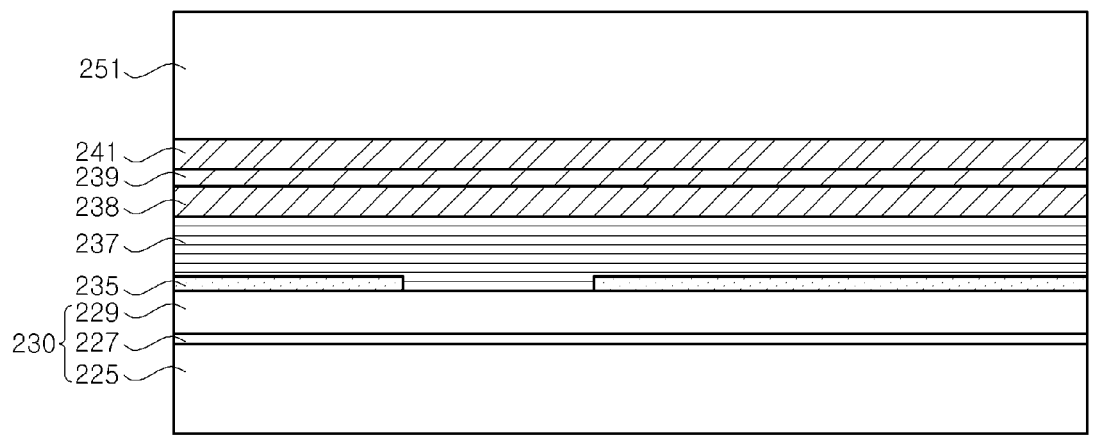

Referring to FIG. 19, the substrate 221 is removed. The substrate 221 may be removed using a substrate separating process such as LLO. As the substrate 221 is removed, a surface of the first conductivity type semiconductor layer 225 is exposed.

Figure 20:
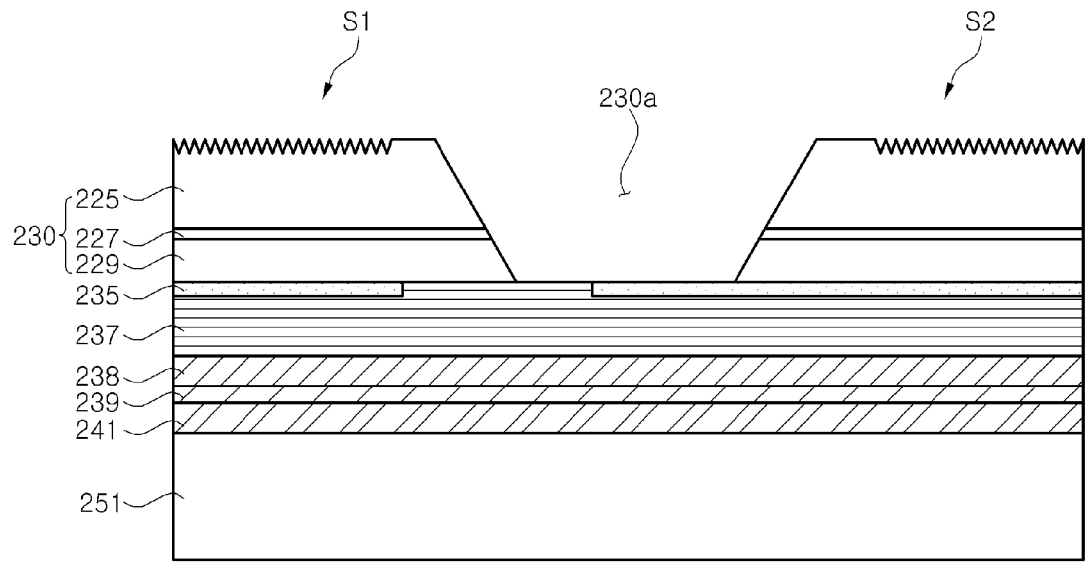

Referring to FIG. 20, a roughened surface R may be formed on the exposed first conductivity type semiconductor layer 225. Although the roughened surface R may be formed on the entire surface of the exposed first conductivity type semiconductor layer 225, the roughened surface R may be confined to a partial region of the entire surface as shown in this figure. For example, a mask (not shown) may be formed on the first conductivity type semiconductor layer 225 so as to expose a region in which the roughened surface will be formed, and then the roughened surface R may be formed only in the confined region using photoelectrochemical (PEC) etching.

Meanwhile, a cell separation region 230a is formed by etching the first conductivity type semiconductor layer 225, the active layer 227 and the second conductivity type semiconductor layer 229, thereby separating the semiconductor stack into light emitting cells S1 and S2. The transparent ohmic contact layer 235 at the lower portion of the second light emitting cell S2 is exposed by the cell separation region 230a. At this time, the transparent ohmic contact layer 235 is formed of a TCO film so as to prevent conductive etching by-products from being formed. Thus, it is possible to prevent an electrical short circuit which might be caused by the etching by-products of the transparent ohmic contact layer 235.

The process of forming the roughened surface R may be performed after the cell separation region 230a is formed.

Figure 21:
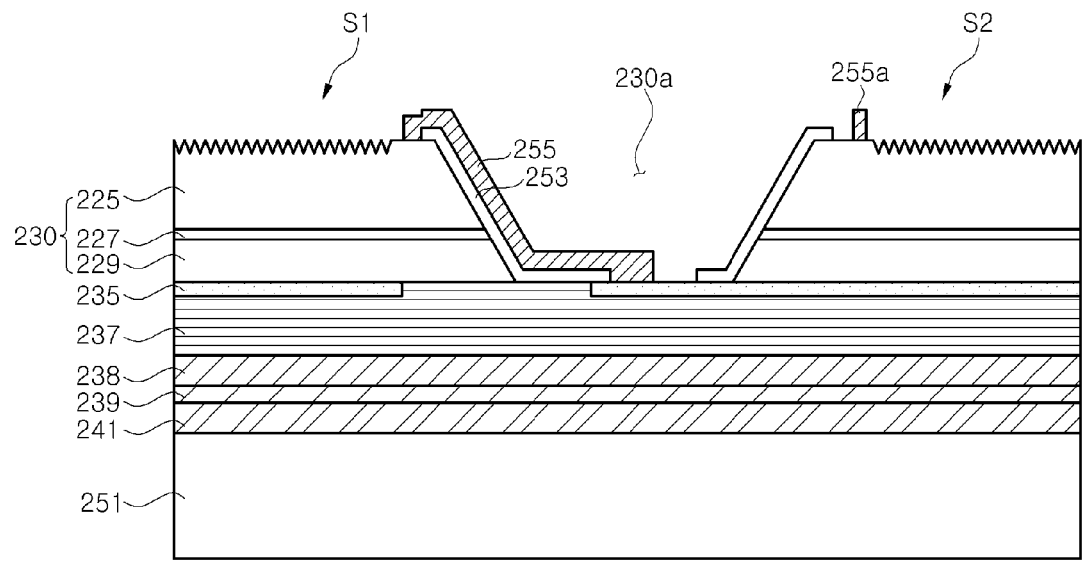

Referring to FIG. 21, a first insulating layer 253 is formed to cover side surfaces of the light emitting cells S1 and S2. The first insulating layer 253 may be formed of $SiO_2$, and covers at least a portion of each side surface of the light emitting cells S1 and S2. Particularly, the first insulating layer 253 may cover a bottom of the cell separation region 230a and an inner wall of the cell separation region 230a. Meanwhile, the first insulating layer 253 may be patterned to have an opening 253a through which the transparent ohmic contact layer 235 is exposed.

Then, a connector 255 is formed to electrically connect the first conductivity type semiconductor layer 225 of the first light emitting cell S1 to the transparent ohmic contact layer 235 exposed to the cell separation region 230a. The connector 255 may be formed using a lift-off process. While the connector 255 is formed, electrode extending portions (255a and 255b as shown in FIG. 14) may be formed together.

Subsequently, a second insulating layer 257 may be formed to cover the first and second light emitting cells S1 and S2, the connector 255, and the first insulating layer 253. The second insulating layer 257 may cover the top surface of the LED except electrode pads (not shown). Accordingly, it is possible to protect the LED from external environmental factors.

Then, an individual LED including a plurality of light emitting cells S1 and S2 is completed through a singulation process.

According to the present invention, it is possible to provide an LED, which can prevent an electrical short circuit in a light emitting cell by preventing metallic etching by-products from being formed, and a method of fabricating the same. Further, a DBR is employed so that the reflectance of the light which is emitted toward a substrate can be improved as compared with a reflective metal layer. Furthermore, since the DBR is formed by alternately stacking insulating layers such as $SiO_2/TiO_2$ or $SiO_2/Nb_2O_5$ whose refractive indices are different from each other, the DBR may be prevented from being deformed by oxidation.

Moreover, connectors are buried into the LED, so that the light emitted from a light emitting surface may be prevented from being lost by the connectors.

Meanwhile, if an ohmic contact is formed using a transparent ohmic contact layer, it is unnecessary to separately form a barrier metal layer for protecting the transparent ohmic contact layer. Thus, a fabricating process may be simplified and an LED with high reliability may be provided.

In addition, an intermediate insulating layer may be formed as a DBR with high reflectance in the wide visible region of blue, green, and red light. In this case, the intermediate insulating layer has a high reflectance with respect to light that is emitted into the LED from the outside, so that a high light efficiency can be realized in an LED package for implementing polychromatic light, e.g., white light.

Although the present invention has been described in detail in connection with the exemplary embodiments, it will be readily understood by those skilled in the art that various modifications and changes can be made thereto within the technical spirit and scope of the present invention. It is also apparent that the modifications and changes fall within the scope of the present invention defined by the appended claims.

What is claimed is:

1. A method of fabricating a light-emitting diode (LED), the method comprising:
    forming a semiconductor stack on a first substrate, the semiconductor stack comprising:
        a first conductivity type semiconductor layer;
        an active layer; and
        a second conductivity type semiconductor layer;
    patterning the semiconductor stack to form connection trenches to expose the first conductivity type semiconductor layer, wherein the connection trenches are separated from one another;
    forming a distributed Bragg reflector (DBR) comprising a multi-layered structure on the semiconductor stack, wherein the DBR comprises openings exposing the second conductivity type semiconductor layer and openings exposing the first conductivity type semiconductor layer;

forming connectors to electrically connect a plurality of regions to one another;

forming a separation insulating layer to cover the connectors;

bonding a second substrate on the separation insulating layer;

exposing the first conductivity type semiconductor layer by removing the first substrate; and patterning the semiconductor stack to expose the DBR, wherein patterning the semiconductor stack forms isolation trenches separating the plurality of regions from one another.

2. The method of claim 1, wherein each region comprises the connection trenches, and the connectors are electrically connected to the first conductivity type semiconductor layers and the second conductivity type semiconductor layers, and the regions are electrically connected to one another.

3. The method of claim 2, wherein the ohmic contact layer comprises a reflective layer or a transparent conductive layer.

4. The method of claim 1, further comprising forming an ohmic contact layer contacting the second conductivity type semiconductor layers before forming the connectors.

5. The method of claim 1, further comprising forming a roughened surface on the first conductivity type semiconductor layer.

6. The method of claim 5, further comprising forming a protective insulating layer to cover the first conductivity type semiconductor layer, wherein the protective insulting layer is arranged in the isolation trenches.

7. The method of claim 1, further comprising forming electrode pads on the first conductivity type semiconductor layer, wherein each electrode pad is respectively arranged on one of the regions separated by the isolation trenches, and the connection trenches are formed in each region in which the electrode pads are formed.

8. A method of fabricating a light-emitting diode (LED), the method comprising:

growing a first conductivity type semiconductor layer, an active layer, and a second conductivity type semiconductor layer on a first substrate;

forming transparent ohmic contact layers on the second conductivity type semiconductor layer, the transparent ohmic contact layers being spaced apart from each other;

alternately stacking insulating layers on the transparent ohmic contact layers to form an intermediate insulating layer of a distributed Bragg reflector (DBR), the alternately stacked insulating layers comprising different refractive indices from each other, the DBR to cover the transparent ohmic contact layers;

coupling a second substrate on the intermediate insulating layer;

removing the first substrate to expose the first conductivity type semiconductor layer;

forming a cell separation region to define a first light emitting cell and a second light emitting cell by etching the first conductivity type semiconductor layer, the active layer, and the second conductivity type semiconductor layer, wherein a portion of the transparent ohmic contact layer is exposed in the cell separation region;

forming a first insulating layer to cover a portion of side surfaces of the first and second light emitting cells; and forming a connector to electrically connect the first conductivity type semiconductor layer of the first light emitting cell to the exposed portion of the transparent ohmic contact layer.

9. The method of claim 8, wherein the transparent ohmic contact layer comprises indium tin oxide (ITO).

10. The method of claim 8, further comprising forming a reflective metal layer on the intermediate insulating layer, before coupling the second substrate.

11. The method of claim 8, further comprising forming a roughened surface on the exposed first conductivity type semiconductor layer.

12. The method of claim 11, further comprising forming a second insulating layer to cover the connector and the first and second light emitting cells, wherein the second insulating layer corresponds to the roughened surface of the first conductivity type semiconductor layer and comprises an uneven shape.

13. A light-emitting diode (LED), comprising:

a substrate;

a semiconductor stack arranged on the substrate, the semiconductor stack comprising:

an upper semiconductor layer comprising a first conductivity type;

an active layer; and a lower semiconductor layer comprising a second conductivity type;

isolation trenches separating the semiconductor stack into a plurality of regions;

connectors disposed between the substrate and the semiconductor stack, the connectors electrically connecting the plurality of regions to one another; and a distributed Bragg reflector (DBR) comprising a multi-layered structure, the DBR disposed between the semiconductor stack and the connectors, wherein the connectors are electrically connected to the semiconductor stack through the DBR, and portions of the DBR are disposed between the isolation trenches and the connectors.

14. The LED of claim 13, wherein at least one of the isolation trenches passes through the upper semiconductor layer, the active layer, and the lower semiconductor layer.

15. The LED of claim 13, wherein a first region comprises a single light emitting cell, and a first connector of the connectors is connected to the upper semiconductor layer and a second connector of the connectors is connected the lower semiconductor layer of the single light emitting cell.

16. The LED of claim 13, wherein the first connector is connected to the lower semiconductor layer in a second region, and the second connector is connected to the upper semiconductor layer in a third region.

17. The LED of claim 13, wherein a first region comprises a common light emitting cell that shares the upper semiconductor layer, a connector is connected to the upper semiconductor layer shared by the common light emitting cell, and the connectors are connected to lower semiconductor layers of the common light emitting cell.

18. The LED of claim 17, wherein the connector connected to the upper semiconductor layer is connected to the lower semiconductor layer in a second region, and at least one of the connectors connected to the lower semiconductor layers is connected to the lower semiconductor layer of an adjacent common light emitting cell.

19. The LED of claim 13, further comprising:

a bonding metal disposed between the substrate and the semiconductor stack; and a separation insulating layer separating the connectors from the bonding metal.

20. The LED of claim 13, further comprising an ohmic contact layer connected to the lower semiconductor layer through the DBR, wherein the connectors are electrically connected to the lower semiconductor layer through the ohmic contact layer.

21. The LED of claim 20, wherein the ohmic contact layer comprises a reflective layer or transparent conductive layer.

22. The LED of claim 13, further comprising a protective insulating layer arranged on the semiconductor stack, wherein the protective insulating layer covers the semiconductor stack.

23. The LED of claim 13, further comprising electrode pads,
wherein each electrode pad is arranged on one of the regions and is connected to the upper semiconductor layer.

24. The LED of claim 23, wherein the region having the electrode pad arranged thereon comprises holes which pass through the lower semiconductor layer and the active layer, and the connector is electrically connected to the upper semiconductor layer through the holes.

25. The LED of claim 13, further comprising a serial array of light emitting cells, wherein the light emitting cells are serially connected by the connectors.

26. A light-emitting diode (LED), comprising:
a substrate;
a first light emitting cell and a second light emitting cell, each of the first light emitting cell and the second light emitting cell comprising:
an upper semiconductor layer comprising a first conductivity type;
an active layer; and
a lower semiconductor layer comprising a second conductivity type;
an intermediate insulating layer disposed between the substrate and the first and second light emitting cells, the intermediate insulating layer comprising a distributed Bragg reflector (DBR) comprising alternately stacked insulating layers, wherein the refractive indices of the alternately stacked insulating layers are different from each other;
a transparent ohmic contact layer disposed between the intermediate insulating layer and the first and second light emitting cells, the transparent ohmic contact layer contacting the lower semiconductor layer of each of the first and second light emitting cells; and
a connector electrically connecting the upper semiconductor layer of the first light emitting cell and the transparent ohmic contact layer.

27. The LED of claim 26, wherein the transparent ohmic contact layer comprises indium tin oxide (ITO).

28. The LED of claim 26, further comprising a reflective metal layer disposed between the intermediate insulating layer and the substrate.

29. The LED of claim 26, further comprising a cell separation region between the first light emitting cell and the second light emitting cell,
wherein the transparent ohmic contact layer extends toward the cell separation region.

30. The LED of claim 29, wherein a first end of the connector contacts the upper semiconductor layer of the first light emitting cell, the connector extends along a side surface of the first light emitting cell, and a second end of the connector contacts the transparent ohmic contact layer in the cell separation region.

31. The LED of claim 30, further comprising a first insulating layer disposed between the connector and the side surface of the first light emitting cell, wherein the first insulating layer insulates the connector from the side surface of the first light emitting cell.

32. The LED of claim 31, further comprising a second insulating layer covering the connector and the first and second light emitting cells.

33. The LED of claim 32, wherein the upper semiconductor layer of each of the first and second light emitting cells comprises a roughened surface, the second insulating layer covers the roughened surface of the upper semiconductor layer, and a surface of the second insulating layer comprises an uneven shape corresponding to the roughened surface of the upper semiconductor layer.

* * * * *